United States Patent
Fromson et al.

(10) Patent No.: US 7,350,991 B1
(45) Date of Patent: Apr. 1, 2008

(54) UNIVERSAL SPRAY PROCESSOR FOR IMAGED PLATES

(75) Inventors: Howard A. Fromson, Stonington, CT (US); William J. Rozell, Vernon, CT (US); William J. Ryan, Enfield, CT (US)

(73) Assignee: Anocoil Corporation, Rockville, CT (US)

( * ) Notice: Subject to any disclaimer, the term of this patent is extended or adjusted under 35 U.S.C. 154(b) by 0 days.

(21) Appl. No.: 11/639,456

(22) Filed: Dec. 15, 2006

Related U.S. Application Data

(63) Continuation-in-part of application No. 11/588,714, filed on Oct. 27, 2006.

(51) Int. Cl.
*G03D 5/00* (2006.01)
*B41N 3/00* (2006.01)

(52) U.S. Cl. .................................. 396/611; 101/463.1
(58) Field of Classification Search ................ 396/604, 396/611; 101/463.1
See application file for complete search history.

(56) References Cited

U.S. PATENT DOCUMENTS

| | | | | |
|---|---|---|---|---|
| 3,752,054 A | * | 8/1973 | Scanlan | 396/611 |
| 4,145,135 A | * | 3/1979 | Sara | 396/611 |
| 2003/0072575 A1 | * | 4/2003 | Fromson et al. | 396/611 |
| 2005/0066830 A1 | * | 3/2005 | Miyagawa et al. | 101/463.1 |

* cited by examiner

Primary Examiner—W. B. Perkey
(74) Attorney, Agent, or Firm—Alix, Yale & Ristas, LLP

(57) ABSTRACT

An imaged plate processor for covering the imaged coating with a turbulent flow of fresh developer solution for a short dwell time, and which preferably can be modified by the end user for development of a wide range of plates. The processor comprises a flat support surface for the plate, a plate feeder to the support surface, a plate transporter, and a nozzle array oriented to discharge developer solution onto a plate as the plate moves along the support surface. A source of fresh developer solution is connected to a pump for pressurizing the developer in the nozzle array in the range of about 5 to 250 psi, whereby fresh developer solution is directed from the nozzles as a pressurized flow pattern transversely onto the plate. A continual flow of fresh developer solution impinges on successive areas of the plate. Adjustable variables for accommodating a variety of plates include at least one of spray pressure and plate transport speed.

30 Claims, 3 Drawing Sheets

| Plate | FPM | PSI | Temp | Benzyl | a-1 | a-2 | 5% | 50% | 2% | 4% | 95% | 98% | 50% | 30% | 10% | 70% | 10% | 30% | 50% | 30% | 97% |
|---|---|---|---|---|---|---|---|---|---|---|---|---|---|---|---|---|---|---|---|---|---|
| Exposed at 15W | | | | | | | | | | | | | | | | | | | | | |
| 1 | 4 | 50 | 69 | 6.5 | -0.69 | -0.69 | 6.2 | 54.0 | 2.4 | 4.7 | 96.8 | 98.7 | 53.8 | 32.0 | 11.3 | 72.2 | 11.5 | 32.9 | 54.1 | 32.8 | 98.3 |
| 2 | 4 | 50 | 75 | 6.5 | -0.64 | -0.67 | 6.0 | 53.9 | 2.4 | 4.7 | 96.1 | 98.9 | 53.9 | 32.4 | 11.5 | 74.1 | 11.3 | 32.9 | 54.3 | 32.3 | 98.1 |
| 3 | 4 | 50 | 80 | 6.5 | -0.67 | -0.68 | 6.1 | 53.7 | 2.4 | 4.8 | 96.2 | 98.7 | 54.3 | 33.1 | 11.2 | 73.0 | 11.2 | 34.2 | 53.6 | 33.0 | 98.1 |
| 4 | 4 | 50 | 85 | 6.5 | -0.67 | -0.66 | 6.1 | 54.0 | 2.4 | 4.6 | 96.1 | 98.6 | 53.6 | 32.8 | 11.4 | 72.9 | 11.2 | 33.5 | 52.9 | 32.1 | 97.9 |
| 5 | 4 | 100 | 85 | 6.5 | -0.66 | -0.64 | 5.9 | 52.5 | 2.6 | 4.8 | 96.4 | 98.9 | 53.5 | 32.0 | 11.0 | 72.8 | 10.9 | 33.1 | 50.5 | 32.5 | 97.6 |
| 6 | 4 | 50 | 85 | 8.5 | -0.69 | -0.67 | 5.9 | 54.1 | 2.4 | 4.8 | 96.2 | 98.7 | 53.5 | 32.8 | 11.3 | 72.3 | 11.2 | 32.2 | 55.4 | 32.5 | 97.8 |
| 7 | 4 | 50 | 85 | 10.0 | -0.66 | -0.68 | 6.4 | 54.0 | 2.5 | 5.1 | 96.3 | 98.7 | 53.7 | 32.3 | 11.1 | 72.6 | 11.3 | 31.9 | 54.7 | 31.9 | 97.8 |
| 8 | 4 | 50 | 99 | 10.0 | -0.64 | -0.63 | 6.0 | 53.4 | 2.6 | 4.8 | 96.2 | 98.7 | 53.8 | 32.6 | 11.1 | 72.5 | 11.0 | 32.6 | 52.9 | 32.4 | 97.7 |
| 9 | 3 | 50 | 101 | 10.0 | -0.66 | -0.68 | 6.0 | 53.6 | 2.6 | 4.7 | 96.1 | 98.6 | 51.7 | 32.5 | 11.3 | 72.2 | 11.3 | 32.7 | 53.5 | 32.4 | 97.8 |
| 10 | 4 | 50 | 77 | 10.0 | -0.70 | -0.64 | 5.9 | 53.8 | 2.3 | 4.9 | 96.2 | 98.6 | 53.7 | 32.3 | 11.1 | 72.3 | 11.0 | 32.5 | 53.5 | 31.8 | 97.7 |
| Exposed at 10W | | | | | | | | | | | | | | | | | | | | | |
| 11 | 3 | 50 | 75 | 6.5 | -0.60 | -0.65 | 5.2 | 51.8 | 2.0 | 4.2 | 95.7 | 98.3 | 52.7 | 31.2 | 10.3 | 71.1 | 10.6 | 31.7 | 52.5 | 31.4 | 97.5 |
| 12 | 4 | 50 | 75 | 6.5 | -0.60 | -0.60 | 5.7 | 51.8 | 2.2 | 4.2 | 95.5 | 98.3 | 52.1 | 31.5 | 10.5 | 71.6 | 10.8 | 31.1 | 51.8 | 31.9 | 97.4 |
| 13 | 5 | 50 | 75 | 6.5 | -0.60 | -0.59 | 5.5 | 53.7 | 2.1 | 4.2 | 95.8 | 98.5 | 52.3 | 31.5 | 10.7 | 71.9 | 10.4 | 31.9 | 51.2 | 30.8 | 97.5 |
| 14 | 6 | 50 | 75 | 6.5 | -0.58 | -0.60 | 5.4 | 52.0 | 2.2 | 4.6 | 95.5 | 98.4 | 52.2 | 31.6 | 10.5 | 71.5 | 10.5 | 31.2 | 53.0 | 31.6 | 97.4 |
| 15 | 4 | 50 | 77 | 10.0 | -0.63 | -0.63 | 5.6 | 51.5 | 2.1 | 4.1 | 95.4 | 98.2 | 52.5 | 31.1 | 10.5 | 71.0 | 10.6 | 31.0 | 52.1 | 30.7 | 97.2 |

FIG. 4

UNIVERSAL SPRAY PROCESSOR FOR IMAGED PLATES

RELATED APPLICATION

This application is a continuation in part of U.S. application Ser. No. 11/588,714 filed Oct. 27, 2006, for "Spray Development of Photosensitive Plates".

BACKGROUND OF THE INVENTION

The present invention relates to the development of planographic printing plates, and especially lithographic printing plates having an imaged photosensitive coating with regions that are soluble in an alkaline developer solution.

Historically, the processing of positive plates involves immersion of the plate in a sump of developer as it passes through a plate processor. The plate then exits the sump, and is typically subjected to a rotating brush or molleton and a nip roll set prior to being rinsed. This method of development relies entirely on the chemical dissolution of the solubilized coating to produce the plate. The developer is an alkaline solution typically containing an alkali metal silicate and/or alkali metal hydroxide along with other wetting agent/surfactants. Positive plate development generally has only small latitude in the development variables. For example, the temperature of the developer is critical, and must be controlled over a small range. The development is influenced by any flow dynamics (e.g. even small eddy currents) in the sump. This presents difficulties to get uniform development or consistent development from plate to plate. It is also difficult to assure that shadows and background areas clean out without attacking highlight dots in halftones.

Negative working plates generally have greater latitude in the development variables. Latitude is in large part determined by the relative solubility between the imaged and nonimaged regions of the coating. In an ideal imaged plate, the relatively insoluble regions experience no dissolution over a wide range of immersion dwell time in the developer solution, whereas over the same wide range of dwell time the relatively soluble regions quickly and completely dissolve. The resulting plate can produce accurate shadows in regions where the relatively insoluble, oleophilic coating has not been dissolved, clean background in regions where the relatively soluble coating has been completely removed, revealing the underlying hydrophilic substrate, and highlights in regions where dots of coating material are closely interspersed with adjacent regions of completely dissolve coating.

In practice, this ideal is not achievable, because the developer solution chemistry, temperature, and dwell time must be traded off to optimize cleanout of background while retaining the small dots of coating that provide good highlights in the printed product. Such optimization typically requires that the developer solution be strongly reactive and the dwell time be of long enough duration, to dissolve all the background, while conditioning agents in the developer solution, such as surfactants, help protect the relatively insoluble regions of the coating from reacting with the reactive ingredient of the developer solution.

SUMMARY OF THE INVENTION

We have discovered that excellent development of both positive and negative plates can be achieved by delivering the developing fluid to the plate over such a short dwell time and at such a high volumetric flow rate that the non-image is completely solubilized without affecting the image.

This discovery has resulted in a new processor for covering the coating with a turbulent flow of fresh developer solution for a short dwell time, and which preferably can be modified by the end user for development of a wide range of plates.

In one sense, the processor can be considered a system for developing a planographic printing plate comprising a flat support surface, a feeder for delivering plates in series to the support surface, and a nozzle array spaced from the support surface and oriented to discharge developer solution transversely onto a plate when on the support surface. A source of fresh developer solution and a supply line cooperate for delivering developer solution from the source to the nozzle array. A pump or the like is provided for pressurizing the developer in the nozzle array in the range of about 5 to 250 psi, whereby developer solution can be selectively directed from the nozzles as a pressurized flow pattern transversely at an area of plate when on the support surface. Transport means move at least one of the plate, support surface, or nozzle array at a constant speed, such that a continual flow of fresh developer solution impinges on successive areas of the plate.

Preferably, a continual flow of fresh developer solution is directed onto each unit area of the coated plate for a local dwelt time of less than about 10 seconds, and then substantially all of the developer solution is immediately removed. At sufficient volumetric flow rate, the developer solution at the target area is constantly displaced during the local development dwell time, whereby no boundary layer forms on and travels with the plate during the development time and thus the target area is always in contact with fresh developer solution.

Development proceeds without a developer strength gradient from the coating surface to the substrate. As a consequence, the plate experiences no localized depletion of developer strength. Relative to known development techniques, the processor of the present invention develops each unit volume of coating, more rapidly and uniformly.

The effectiveness of the spray technique in directing a continual flow of fresh developer that solubilizes successive unit areas of coating over a short dwell time, is due in large part to overwhelming the coating with a far greater volume of fresh developer per unit time, than is available conventionally. This overwhelming presence of fresh developer can be established and controlled by simple mechanical relationships on the processor, and readily adapted for cost-effectiveness specific to each of a wide variety of plates.

This has resulted in another preferred aspect, directed to a universal processor, in which at least the spray pressure can be adjusted within a low range, for plates with coatings that solubilize quickly, and within a high range, for plates with coatings that solubilize more slowly and need a stronger impulse to assure removal from the substrate. For example, a pressure regulator or distinct pumps can be provided for alternatively pressurizing within a low pressure range and high pressure range that differ by at least about 50 psi, such as 5-25 psi and over 75 psi.

If the spray pressure selected in the high range is insufficient to clean out all the background, a brush or the like can augment the main developer solution removal device. In the universal processor, the brush can be mounted for selective deployment for wiping the plate after the plate has passed through discharge nip rolls, and withdrawal to permit plates to pass without wiping.

Another adjustment on the universal processor can include means for alternatively moving the plate at two or more constant speeds that differ by at least about 50%.

In one implementation, the developer solution need only be sufficiently alkaline to enable the fluid to dissolve the coating. Consequently, the alkaline developer composition sufficient to give excellent results for thermal positive working plates can be simply water with approximately 5% sodium metasilicate, applied at ambient temperature. For thermal negative working plates and a standard benzyl alcohol concentration of 5-10% with additives (e.g. surfactants), best results are achieved with the addition of an anti-foaming agent in the developer solution and the application of an impulse force to help dislodge any partially solubilized coating during the dwell time under the spray. Preferably, this impulse force is automatically generated by using a high pressure developer spray.

The resultant developed plate has excellent uniform development. The background and shadows clean out thoroughly and the highlight dots are retained. The spray is preferably applied by one or more spray bars with overlapping nozzle flows. Thus the processor length can be significantly shortened.

The imaged plate is preferably developed by conveying the plate on a flat support surface along a linear path in a conveying direction at a constant speed and subjecting successively overlapping target areas of the imaged coating to a pressurized, turbulent flow of developer solution. Other techniques for subjecting the target area to a turbulent flow of substantially homogeneous fresh developer are within the spirit and scope of the invention.

Another embodiment is directed to a processor system having a closed source vessel containing fresh developer solution, and a supply line that delivers developer solution from the source vessel to the nozzle array. Developer overflow is preferably recycled, and a replenishment flow of developer chemical can compensate for drag out and any other diminution of recycled developer effectiveness.

It can be appreciated that with the present invention, a unit area of coating is in contact with fresh developer continuously for a short but known local dwell time, and that all such unit areas on the same plate and for all subsequently developed plates experience at least a prescribed minimum dynamic development condition. Rather than achieving uniformity of development conditions by applying a known quantity of developer solution on a unit area of the plate and maintaining quiescence during a long and slow conveyance while that same quantity of developer percolates through the soluble regions, the present invention relies on the antithesis of quiescence, i.e., turbulent contact with fresh developer over a short dwell time.

The high volumetric flow rate for a short dwell time per unit area of the plate, can be characterized as at least about 0.2 and preferably 0.5-5.0 cc per $cm^2$ per second, for a dwell time of up to about 10 seconds, preferably about 2-5 seconds. It should be noted that the preferred upper limit of 5.0 cc per second per $cm^2$ is given as a practical guideline, and that there is no limiting maximum flow rate within the inventive concept. This represents a total volume of developer per unit area at the plate surface over the local dwell time, that is at least about ten times greater than the plate experiences in a typical sump type developer station or processor. This high volumetric flow rate directed at the plate surface, prevents the formation of a boundary layer and thus assures that the coating always sees fresh developer throughout the dwell time.

An advantage arising from the range of conditions that yields acceptable developed plates, is that optimization can be achieved by mechanical adjustment or control, rather than by chemistry or temperature control. This is far easier, especially in commercial end-user operations where laboratory exactitude cannot be expected. Furthermore, a variety of plate types and sizes can be accommodated by easy adjustments to a universal developer station, such as discharge pressure, number of nozzles required to span the plate width, transport speed, and developer solution. Because only fresh developer is continuously contacting all the coating for substantially the same dwell time, without interference by a boundary layer, localized currents, or non-uniform rates of diffusion through the coating, increasing the plate size does not increase the variability of the development from one corner or edge of the plate to the opposite corner or edge.

Once a station has been calibrated for a particular plate size and type, uniformity of development is achieved automatically. If during calibration plates are either under or over developed, simple mechanical adjustments can be made to achieve satisfactory development. Chemical adjustments are not required.

BRIEF DESCRIPTION OF THE DRAWING

Embodiments of the invention will be described with reference to the accompanying drawing, in which:

FIG. 4 is a compilation of data showing the wide latitude of development variables available with the present invention, for achieving good quality results in a negative working thermal plate;

DETAILED DESCRIPTION

Figure 1:
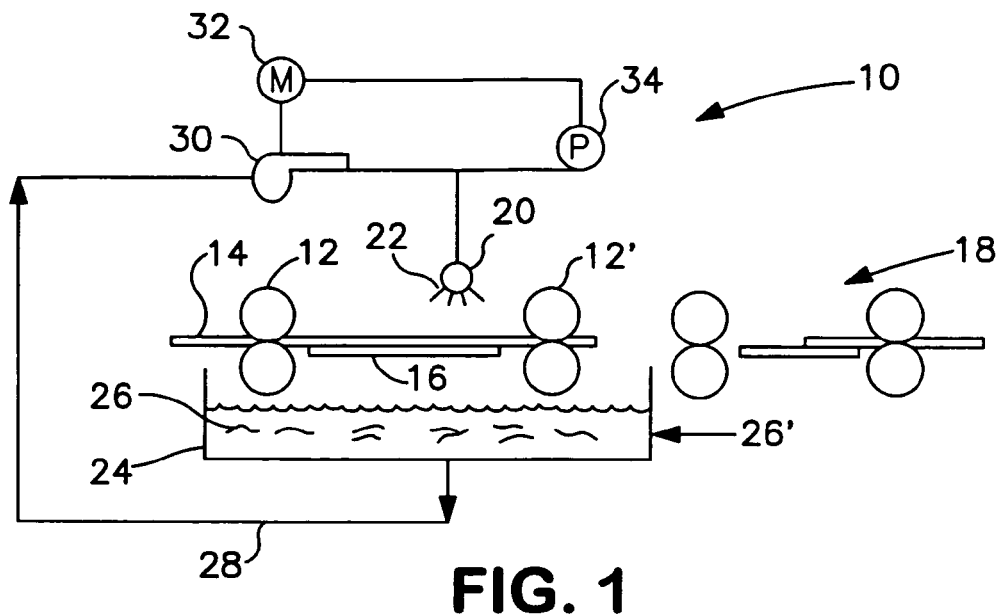
FIG. 1 is a schematic elevation view of a developer station having an array of spray nozzles for implementing one embodiment of the invention.

FIG. 1 is a schematic representation of a developer station 10 for implementing the invention with a pressurized spray of developer solution. A feeder (not shown) delivers an imaged plate 14 to a flat platen or bed 16, on which the plate will be fully developed. Preferably, the plate is transported across the platen 16 by a set of nip rolls 12, 12' spaced apart less than the length of the plate. Typically, other steps such as drying 18 can be performed after the plate 14 is passed on to another set of transport rolls. A spray header 20 delivers a dynamic spray flow 22 of developer solution transversely onto successive target areas of the plate 14 as the plate moves relative to the header 20. Nip roll 12' (or a brush, squeegee or the like) located immediately downstream of the spray pattern, assures that a negligible residual of developer remains on the plate after a given portion of the plate has been developed by and has emerged from the spray pattern.

Spent and overflow developer solution is captured in a sump 24 below support surface 16. The sump contains the source volume 26 of developer solution (for example, five to fifteen gallons). A source supply line 28 directly connects the sump with pump 30. The developer supplied via line 28 to pump 30, can be considered "fresh" in the sense that it has the required alkalinity to support the chemical reaction associated with dissolution of the relatively soluble regions of the coating (e.g., pH in the range of 9 to 13.5). Pump 30 is operated by motor 32, for delivering high pressure developer solution to the spray header 20. A pressure sensor 34 can be connected to the pump output, with a controller associated with the motor 32, for maintaining the pressure within a tight band around a desired set point. Preferably, the source can be supplemented by a flow 26' of replenishing chemical to compensate for drag out (e.g., 7 cc per square foot of developed plate) and chemical depletion due to the dissolution reactions with the coating.

The imaged plate is of a type generally known as a planographic printing plate, having a substrate of, e.g., grained, anodized, aluminum, and a photosensitive coating covering the substrate. The coating has been imaged to produce regions that are relatively insoluble in an alkaline developer solution and regions that are relatively soluble in such developer solution. The imaged coating is subjected to a continuous and dynamic flow of fresh alkaline developer solution, such that a given unit area of coating experiences turbulent contact with developer solution, rather than boundary layer contact. This turbulent contact continues as coating material is dissolved, down to the substrate. In particular, as the plate is transported and developer solution deposited, a given unit volume of deposited fresh developer solution remains on a unit area of the plate for only an instant. Such unit volume of developer solution may react and become spent to some degree, but the dynamic flow of the spray pushes the spent unit volume away and essentially instantly presents another unit volume of fresh developer to the unit area. Thus, fresh developer contacts a given unit area of the plate continuously for a dwell time sufficient to clean out the background (relatively soluble regions of coating) while retaining the images (relatively insoluble regions of coating).

Figure 2:
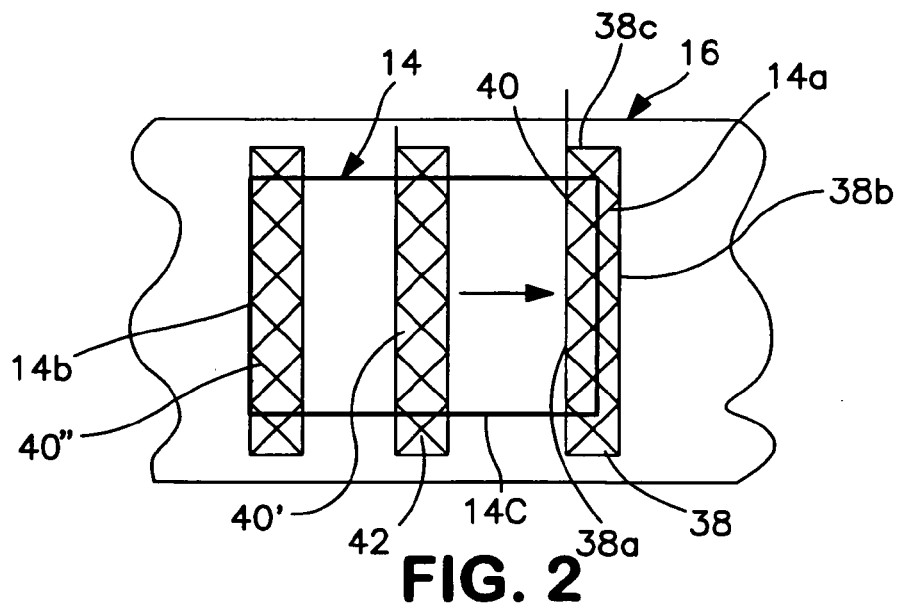
FIG. 2 a schematic representation of the continuously moving target area of spray impingement.
Figure 3:
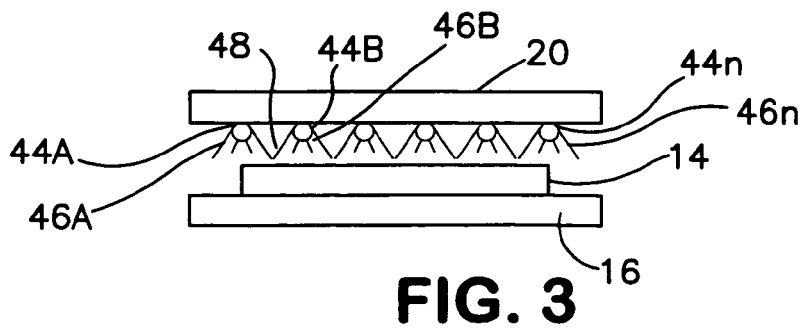
FIG. 3 is a schematic view of the spray bar and spray pattern, as seen from the right of FIG. 1.

FIGS. 2 and 3 illustrate the preferred technique for depositing the developer solution onto the plate. The plate 14 has a front end 14a, back end 14b, and sides 14c, defining a footprint on the support surface 16, that is shorter from side to side 14c, than the width of the support surface. The support surface is flat, so the plate 14 is likewise flat as the plate is transported. As the plate approaches the header 20, the front end enters the spray pattern 38, which is preferably rectangular with front impact line 38a, back impact line 38b and side impact lines 38c. As the plate enters the spray pattern 38, a plate target area 40 is flooded with developer solution. The spray pattern should have a greater width across sides 38c, than the width of the plate across sides 14c, resulting in a slight overlap 42 onto the support surface 16. The target area on the plate 14 flooded by the spray, moves across the plate at a constant speed, as the plate is transported under the header 20. Thus, successively overlapping target areas of the plate are subjected to a spray of fresh developer solution. In this context, "successively" means continually advancing.

The position of the spray pattern and thus target areas at three different and non-contiguous moments in time, are shown schematically at 40, 40', and 40" in FIG. 2. Preferably, the spray pattern is directed at a forward angle, e.g., about 20 to 45 degrees, so that the momentum of the spray at the plate surface pushes the applied developer solution toward the front of the plate, away from areas of the plate that have not yet reached the spray pattern. In the preferred embodiment, the spray pattern should impinge on only a portion of the plate, preferably less than 25% of the total area of the plate. Most favorably, the pattern impinges a target area that is less than about 20% of the total area of the plate. Stated differently, for a plate having a length in the range of about 20-30 inches, a substantially rectangular spray pattern having one dimension spanning the entire width of the plate and another dimension of about 3 or 4 inches along the plate length, would impinge on a target area in the range of about 10 to 20 percent of the total plate area.

FIG. 3 shows that spray header 20 has a multiplicity of spaced nozzles 44a, 44b, . . . , 44n, each of which produces a spray stream 46a, 46b, . . . , 46n that may optionally overlap as shown at 48. The spray streams can be tuned with respect to direction, shape, and overlap, whereby the impact of the overall spray pattern on the target area 40 of the plate, is preferably substantially uniform with respect to volume of developer solution impingement per unit area of the target surface per unit time, and surface turbulence. Although the plate target area should experience a continuous turbulent flooding, the spray can be discontinuous, e.g., pulsed, because the volumetric flow rate of spray is much higher than needed to dissolve the soluble regions on a strictly quiescent basis.

The spray can thus be adjusted to provide sufficient volume and pressure to push spent developer solution off the target area and thereby maintain fresh developer solution in contact with the coating throughout the target area. It is believed that dissolution of the soluble coating regions is achieved quickly and uniformly, by a flooding of the line of impingement of the developer solution (e.g., at 38a) with the newly presented coating arriving on the surface 16, such that the developer solution overlaps with turbulence at the line of impingement to the extent that the developer solution is constantly displaced, and replaced with fresh developer solution.

It can be appreciated that the dynamic flow of developer solution can be applied to the plate by means other than an array of spray nozzles spaced across the width of the plate, but such nozzle array is most convenient for new or retrofit developer stations. Any equipment or device that can flood the target area with fluid having momentum at the impingement contact with the plate, in distinction from or in addition to merely gravity driven drops, drips, and dribbles should be suitable for practicing the present invention. In all of these any of these embodiments, the coating is in essence covered with a turbulent flow of fresh developer solution.

Such flooding should be adjusted or settable to achieve at least the minimum dynamic flow conditions as seen by the target area of the plate. Because the flow rate is so high, it is not necessary that within the spray pattern, each unit area of spray cross section have the exact same flow rate. Rather, it is important that for the local development dwell time (time under the spray pattern), each unit area of plate surface remains turbulently flooded with fresh developer.

It is also not necessary that the impact of the dynamic flow be so great as to physically dislodge partially dissolved coating material from the substrate or from neighboring coating material that has not yet experienced any dissolution. The dynamic aspect of the flooding requires only that the flow have sufficient momentum to push away depleted solution and prevent a boundary layer from forming during the development dwell time. However, it is within the scope of the invention that the dynamic flow is at such high velocity that some physical dislodging of coating material occurs.

In one implementation using equipment such as depicted in FIGS. 1-3, the header 20 is about 3 inches above the conveyed plate, and the spray pattern at the plate surface is about 3 inches from front 38a to back 38b. With a transport speed of about 7 feet per minute, a given unit area of the plate is subjected to the spray pattern for a period of only 2-3 seconds. With the nip roll 12' positioned immediately after the back 38b of the spray pattern, no significant residual developer solution remains on any given unit area of the platen. In other embodiments and variants, the development period for any unit area of plate surface would be less than 10 seconds, preferably in the range of 1-5 seconds.

The invention has been described in the context of a developer station having a sump 24 in which a standing volume 26 of developer solution is maintained for recycling back to the spray header. To reduce degradation of the developer solution through surface reaction with carbon dioxide in the ambient air, a hood or cover can be positioned over the sump, with flaps or the like at the feed and discharge ends, and gaskets along the sides where the hood rests on the frame of the developer station. Alternatively, the sump could merely function as a funneling device, with the bulk of the overall developer volume contained in a closed source vessel, which in turn has a fluid line corresponding to line 28 in FIG. 1, for delivery to the pressurizing device. Replenishing developer can be added to the sump or to the vessel.

We have demonstrated that the invention can be effectively practiced over a wide range of dynamic flow conditions at the target area on the plate. A Proteck XPH developing station was used, with modifications to pressurize the supply line 28, distribution header 20 and nozzles 44 to process imaged plates. Proteck equipment is available from Proteck Circuits & Systems Ltd., Shollinganallur, Chennai, India. The nozzles were 3 inches above the plate and the spray pattern impacted the plate at an approximate 30-degree forward angle. The plates were positive working thermal plates, Type 830.22 T, available commercially from Anocoil Corporation of Rockville, Conn., imaged identically with a Creo Trendsetter Thermal Imager at 100 mJ/cm$^2$ applied energy. Using a simple 5% sodium metasilicate solution as the developer, plates were successfully processed over a temperature range of 70 to 90 degrees F., a spray pressure range of 50 to 250 psi and throughput speeds of 1.5 to 4.0 cm/sec. Plates exhibited clean backgrounds. Measurement of the halftone values showed them to be in excellent agreement with the target values in highlight, mid-tone and shadow dot areas.

The invention further allows for plates to be developed such that the non-image background areas of the plate are cleaned out without losses of coating in the image areas. This was demonstrated in a series of test measurements as described below. Examples 1 through 3 were conducted to measure the amount of image coating loss that occurs for unexposed coating under the conditions described. Examples 4 through 6 demonstrate the efficiency of removal of the non-image background after the coating was blanket exposed (i.e., the entire coating was subjected to imaging radiation to solubilize the coating) at an exposure of 100 mJ/cm$^2$. All plates are Anocoil 830.22 T positive working thermal plates. In all cases the developer temperature was 75 degrees F.

EXAMPLE 1

An unexposed plate was processed using the modified PROTECK XPH spray development apparatus. The developer solution was 5% sodium metasilicate (SMS), the plate dwell time under the spray was 5 seconds and the spray pressure was 70 psi. This plate exhibited a 0% loss of coating.

EXAMPLE 2

An unexposed plate was processed in the same manner as in Example 1 except that the plate dwell time was increased to 20 seconds. This plate exhibited a 23% loss of coating.

EXAMPLE 3

An unexposed plate was processed in a standard immersion type processor, model MX-33 available from CA Systems, Fort Atkinson, Wis. The developer was T-8 Thermal developer commercially available from Anocoil Corporation, which is formulated for use in this type of processor. The plate dwell time was 20 seconds in the sump of developer. This plate exhibited a 10% loss of coating.

EXAMPLE 4

A blanket exposed plate was processed as in Example 1. This plate exhibited a 100% removal of the background.

EXAMPLE 5

A blanket exposed plate was processed as in Example 3 except that the developer was a 5% SMS solution and the plate dwell time was 5 seconds. This plate exhibited a 53% removal of the background.

EXAMPLE 6

A blanket exposed plate was processed as in Example 3. This plate exhibited a 64% removal of the background.

The following conclusions can be drawn from these examples:

The inventive method of applying a simple developer composition with a 5 second dwell using a 5% sodium metasilicate (SMS) results in no loss of coating (Example 1) with complete removal of the background (Example 4).

The conventional method of plate processing in a quiescent sump with a 20 second dwell using a commercial developer (T-8) results in a 10% loss of coating (Example 3) while removing only 64% of the background (Example 6). A mechanical assist (brush) is needed to complete the background cleanout.

Example 5 shows that without the turbulence of the present invention, the background is not cleaned out in the 5 second dwell. Thus we can conclude that the success of Example 4 is not merely the result of using the 5% SMS.

Example 2 shows that spraying the 5% SMS solution for 20 seconds would result in a substantial coating loss. Thus the development time should be kept well below that of conventional development. The fact that no coating loss is seen in Example 1 is the result of the short dwell time, and is not due to the choice of 5% SMS as the developer.

The objective of the development process is to completely remove the non-image background without attacking the image coating. In conventional development there is a compromise in trying to achieve this objective; the coating suffers some loss (10% in Example 3) during the dwell required for development. In the inventive method, we are able to remove the background completely in such a short time that there is no loss of coating. Coating loss is not specific to orientation; the dissolution of the coating will take place at the top surface of the coating and at the sides of the halftone dots in a screened image. Thus in the present invention, since the background is removed before the alkaline developer begins to attack the coating, the highlight dot integrity is maintained, and even the smallest of dots are retained.

As an example, a plate having a width of 50 cm can be subjected to a spray whereby an area of turbulent flow is established between the impingement of the spray and a set of nip rollers such that an area of 500 cm$^2$ is subjected to the turbulent flow condition at any given time. At a flow rate of 300 cc/sec, a plate moving at 2 cm/sec will have a dwell time of 5 seconds under the turbulent flow. Thus there will be 1500 cc delivered to the surface area during this dwell time. In this example, each sq cm of plate area will see 3 cc of developer volume during the 5 second dwell in the turbulent flow. Generally, the flow rate on the plate surface should be greater than about 0.2 cc per cm$^2$ per second, and is preferably in the range of about 0.5 to 5 cc per cm$^2$ per second.

In a conventional bath type processor, the plate moves through the fluid at the rate of about 2.0 cm/sec. The determination of the exact dimensions of a boundary layer is a complex fluid dynamics exercise. We can make some simple assumptions to differentiate sump development from the present invention. If the boundary layer is 1.0 mm thick, in the case where there is no exchange between the boundary layer and the bulk sump volume, the plate only sees 0.001 cc of developer per cm$^2$ independent of dwell time. If we assume that the developer exchange is as high as once per second, the plate "sees" a total 0.02 cc of developer per cm$^2$ during a 20 second dwell.

The exact conditions that are suitable will vary for any given combination of coating composition and developer solution. The main objective is to ensure that there is constant turbulent flow during the dwell time with at least the minimum volume of developer solution required to remove the coating from the plate non-image background areas.

Given the very narrow window and marginal success of present commercial processes for optimizing the tradeoff between cleaning out the background while retaining high image resolution over the full range of gray scale values, the ability of the present invention to easily and consistently preserve 99% shadow dot density, while holding 1% highlight, is extraordinary. This is achieved on a positive working thermal plate with a simple alkaline developer solution that does not require conditioners, such as a surfactant, to reduce dissolution of the relatively insoluble regions while the background can be cleaned out of the relatively soluble regions. Moreover, any optimization can be implemented easily by mechanical adjustment, rather than delicate chemistry and temperature control.

Tests were also conducted on negative working thermal plates, with the test data shown in FIG. 4. The data demonstrate the remarkable processing latitude of the present invention. The headings and data in the table are as follows: Column 2 gives the processor throughput speed in feet per minute; Column 3 gives the pump pressure in psi; Column 4 is the temperature of the developer in degrees F.; and Column 5 is the percent of benzyl alcohol in the developer. The balance of the developer composition is the same for all plates in the table. Columns 6 and 7 are the "a" values for the plate background measured in an area on the top half of the plate (a-1) and the bottom half of the plate (a-2).

The rest of the columns are the measured halftone values in the target areas of the plate. The column heading is the nominal target value. The duplicate values (e.g., 3 columns with a 50% target) reflect the fact that the test image contains multiple targets with the same nominal target value. The measurements in each column are for the target on the equivalent plate location.

The data are separated into two groups; plates 1-10 imaged at 15 watts, and plates 11-15 imaged at 10 watts. The halftone values will vary with imaging power (since this means the imaging energy was different), so comparisons should be made within these groups and not between the two groups.

The influence of the processing variables can be assessed as follows: Plates 11-14 show the variation of processing speed from 3 FPM to 6 FPM. Plates 4 and 5 show the change in pump pressure from 50 to 100 psi. Plates 1-4 show the temperature range from 69-85 degrees F. Plates 7, 8 and 10 show the temperature range from 77-99 degrees F. at a second benzyl alcohol level. Plates 4-6 show the variation of benzyl alcohol content from 6.5% to 10%.

The conclusions to be drawn include that the plate quality is excellent and the quality does not vary significantly over a wide range of development variables.

Figure 5:
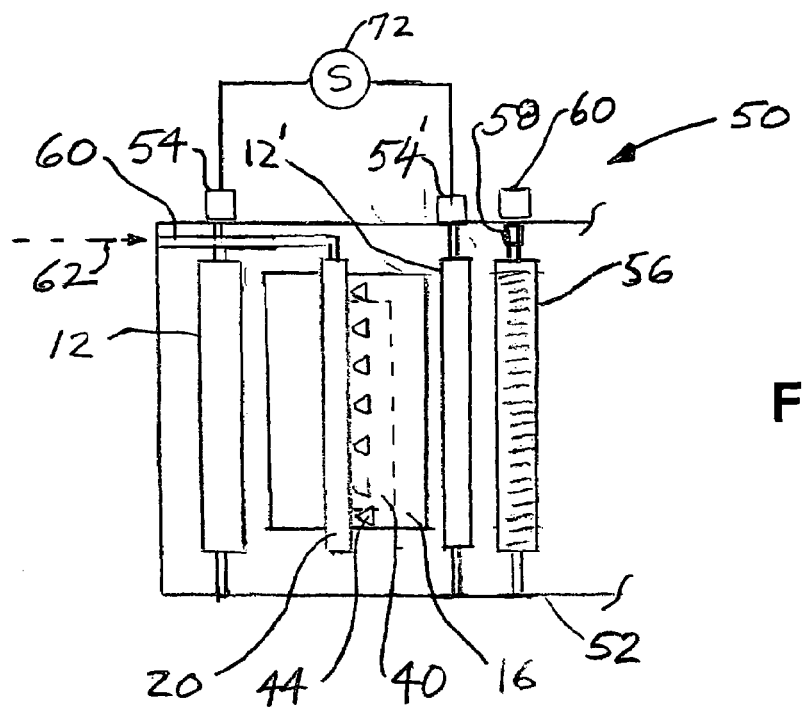
FIG. 5 is a schematic representation of an alternative embodiment, wherein a brush is used to clean out remnants of developer solution and solubilized coating that might be trapped in the grain of the plate substrate.
Figure 6:
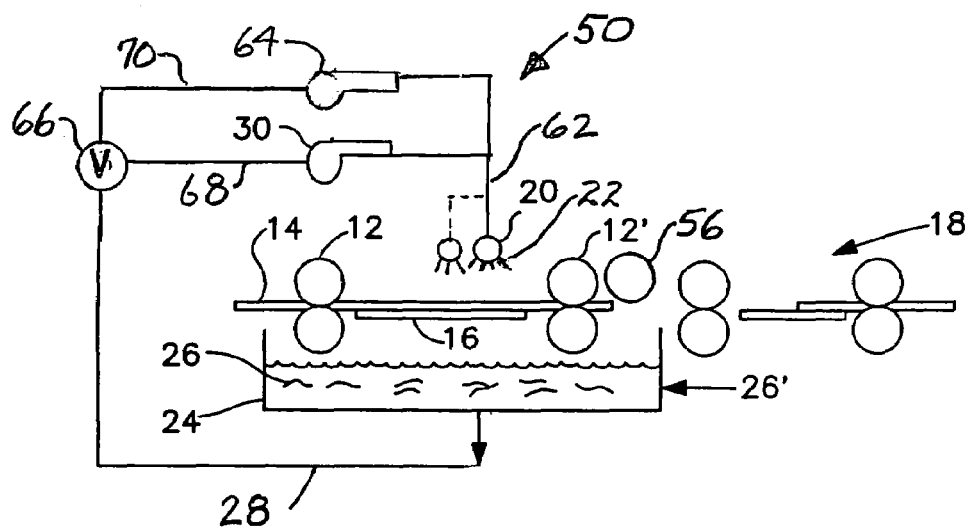
FIG. 6 is a schematic representation of a developer station of the type shown in FIG. 1, modified to provide a universal capability for positive and negative working plates.

FIGS. 5 and 6 show an alternative embodiment 50 of the processor shown in FIG. 1, that is easily adapted to develop a variety of positive and negative plates. FIG. 5 is a schematic top view of the developer portion 50 of the overall processor, wherein like numerals in FIGS. 1, 2, 3 and 5 and 6 denote like structures and functions. The developer station has a frame 52, the front portion of which supports the components associated with the developer portion 50. The feed and nip rolls 12, 12' are supported in the frame 52 by shafts or the like, and each has an associated motor 54, 54' (or one motor with associated belt drive) for rotating the rolls 12, 12' in coordinated relationship to transport a plate (not shown) along the support surface 16. A switch 72 can be manually set to a plurality of positions, thereby selecting one of a plurality of available transport speeds for the plate beneath the spray header 20.

As previously described, the spray header 20 has a plurality of spray nozzles 44 that direct a pressurized spray pattern onto a target area 40 (shown in phantom) as the plate is transported on the support surface 16. In this embodiment, a brush 56 is supported by the frame 52, preferably by a detachable or pivotable member 58. The cylindrical brush 56 is located downstream of the second, or discharge nip roll 12' and oriented transversely to span the width of the plate as it emerges from the nip roll. The brush can be driven with its own motor 60, or a takeoff from another motor, or it can be biased with a certain amount of resistance against the transport of the plate.

Line 60 within or along side the tank 52 delivers fresh developer solution to the spray header 20. As shown in FIG. 6, two pumps 30, 64 are arranged in parallel, with either one configured to discharge pressurized developer into line 62. A valve or switch 66 can be set to open either line 68 or line 70, for delivering fluid from line 28 to either pump 30 or pump 64, respectively. In this embodiment, pump 30 pressurizes the header within a low pressure range, such as 5-25 psi, whereas pump 64 pressurizes line 62 within a high pressure range, such as 50-250 psi. In general, the high pressure pump will deliver fluid to line 62 at a pressure at least 50 psi greater than the pressure that can be delivered by the low pressure pump. It should be appreciated that other configurations for achieving distinct high and low pressure output from the spray header 20 can be employed. For example, one variable pressure pump could be employed such that the operator can select any of a plurality of preestablished pressure targets, either via pre-calibration or by automatic or manual feedback with a pressure sensor or regulator such as 34 shown in FIG. 1. In the configuration shown in FIG. 5, each pump 30, 64 can have a preset operating pressure, or each can be variable, one in a lower range and one in a higher range.

The high pressure spray embodiment with pump 64 operational, provides an impulse or mechanical assist for accelerating the dissolution and removal of the coating. The brush 56 after the nip rolls 12' assures that any miniscule pockets or particulates of solubilized coating that might have been dragged through the nip rolls by the grained surface of the plate substrate are finally cleaned out. The shorter the dwell time, the more likely that the brush 56 will be required, especially for negative working plates. By the time the plate reaches the brush 56, the nip rolls have already removed all of the flowing developer solution from the plate, with substantially no developer solution remaining, so there is no risk of coating loss during the transport time between the nip rolls 12' and the brush 56.

It can thus be appreciated that the developer station 50 of the plate processor can be configured with at least one of adjustable spray pressure, adjustable plate transport speed, and deployment or withdrawal of the brush 56. When further taking into account that the developer solution 26 can easily be changed as between any of the variety of alkaline, or any of the variety of solvent based solutions, one can appreciate the multitude of combinations that are possible with this universal developer station. As a first level of adjustability for accommodating different types of plates, the spray pressure is adjustable between a relatively high and a relatively low value. A second adjustment is the deployment or withdrawal of the supplementary brush 56, preferably deployed together with the high pressure option on the spray header. Particularly in situations where greater than about 50 psi difference cannot be achieved between the high and low pressure conditions, a third adjustment, of the transport speed, can compensate to some extent by significantly increasing or decreasing the total volume of fresh developer applied to a given unit area, by increasing or decreasing the local dwell time.

In the most advantageous implementation of the invention as shown in the Figures, the support surface 16 is stationary and the plate 14 is transported relative to the stationary plate 16 and header 20. This configuration requires the least deviation from known processor configurations. However, in alternative implementations, well within the ordinary skill of manufacturers of plate processors, the support surface 16 could be an endless belt on which the plate 14 is conveyed beneath a spray header 20, or the plates could be sequentially fed to a flat support surface 16, where the plate is stationary while the header 20 moves horizontally over the plate, whereupon that plate is removed and another is placed on the support surface. Another option is to provide a plurality of parallel spray headers or bars spaced apart in the transport direction. For example, two could always be active simultaneously at the same pressure, or the operator could alternatively select either a one header or two header active configuration at the same pressure, or one bar could be connected to a high pressure pump and the other to a low pressure pump.

With any of these implementations, the preferred range of delivering about 2-5 cc of a turbulent flow of fresh developer solution for less than 10 seconds, preferably about 1-5 seconds local dwell time can be achieved. In general, the spray floods each square centimeter of plate surface with about at least 2 cc of developer solution during a local dwell time of less than 10 seconds. The transport speed would typically be in the range of 3-10 feet per second, with 3 feet to 6 feet per second being more typical, but in general, the available difference in speed should be such that the operator select from at least two constant speeds that differ by at least about 50%.

The fundamental concept of utilizing a continual spray of fresh developer solution that prevents creation of a boundary layer, applied over a relatively short local dwell time, has applicability to both positive and negative plate types, having sensitivity to radiation over a wide range of wave lengths. In particular, with the universal processor as described above, one can take advantage of the broad implications of this concept. The inventive processing technique has been successfully demonstrated in the laboratory with the following plate/developer combinations:

1. Positive working thermal plates (inhibited phenolic resin type coating) with mono-component sodium metasilicate developer and multi-component alkaline developer.
2. Pre-heated negative working thermal plates (photopolymer) with less than 4% mono-component benzyl alcohol developer and multi-component alcohol based developer.
3. Negative working conventional UV imagable plates (photopolymer/diazo hybrid) with multi-component alcohol based developer.
4. Pre-heated Negative working violet plates (photopolymer) with multi-component alkaline developer.

The present invention thus has applicability in a range of imaging technologies.

With any implementations of the present invention, the equipment and process are to be set up and calibrated for optimization within an acceptable performance window. This window lies between a dwell time (or flow rate) that is too low, and therefore will not fully dissolve the background regions, and a dwell time that is too long (or flow rate too high), which will not only remove all of the background, but will begin attacking the relatively insoluble regions. We have found that in general, a total developer flow volume of about 0.2 to 5.0 cc per $cm^2$ per second, delivered over a dwell time of less than 10 seconds, is within this window for most plates.

The invention claimed is:

1. A system for developing a planographic printing plate having an imaged coating on a substrate, comprising:
   a support surface;
   a feeder for delivering said plate to the support surface;
   a nozzle array spaced from the support surface and oriented to discharge developer solution transversely onto a plate when on the support surface;
   a source of fresh developer solution;
   a supply line for delivering developer solution from the source to the nozzle array;
   means for pressurizing the developer solution in the nozzle array, whereby developer solution can be selectively directed from the nozzles transversely at an area of plate when on the support surface at sufficient pressure to maintain a pattern of turbulent flow on said area; and
   means for removing all said flowing developer solution from said area after a preestablished dwell time.

2. The system of claim 1, including means for moving at least one of the plate, support surface, or nozzle array at a constant speed along a process direction.

3. The system of claim 1, including a sump for capturing developer that overflows the support surface and combining the captured flow with said source, whereby developer solution is continuously recycled from the source, through the supply line, as said flow of fresh developer through said nozzles, as said overflow in said sump, and back to the source.

4. The system of claim 3, wherein said source is a basin in said sump.

5. The system of claim 4, including a second source of developer chemical, for replenishing the recycled developer solution.

6. The system of claim 1, wherein
at least one of said flow rate or said constant speed of movement is adjustable; and
said developer solution is at a pressure and volume such that the pressurized flow pattern directed from the nozzles at an area of the plate when on the support surface floods each square cm of plate unit area with about 2-5 cc of a turbulent flow of fresh developer solution for about 1-5 seconds local dwell time.

7. The system of claim 6, wherein said means for removing developer solution are provided immediately downstream of said flow pattern, and remove substantially all developer solution on said unit area after said local dwell time.

8. The system of claim 1, wherein said flow floods each square cm of plate surface with at least about 2 cc of developer solution during a local dwell time of less than 10 seconds.

9. The system of claim 8, wherein said means for removing developer solution are provided immediately downstream of said flow pattern, and remove substantially all developer solution on each said area after said local dwell time.

10. The system of claim 9, comprising a brush immediately downstream of said means for removing developer solution, for cleaning out any residual material on the plate.

11. The system of claim 1, wherein the developer solution comprises an alkaline developer solution.

12. The system of claim 1, wherein the developer solution comprises a benzyl alcohol solution.

13. The system of claim 1, wherein the volumetric flow of developer solution on the plate is at least 0.2 cc per cm$^2$ per second.

14. The method of claim 13, wherein the dwell time is in the range of 2-5 seconds.

15. The system of claim 1, wherein the plate is conveyed at a speed in the range of 3-10 feet per minute.

16. A system for developing a planographic printing plate having an imaged photosensitive coating on a substrate, comprising:
a flat support surface;
a feeder for delivering said plates in series to the support surface;
a nozzle array spaced from the support surface and oriented to discharge developer solution transversely onto the plate when on the support surface;
a source of fresh developer solution;
a supply line for delivering developer solution from the source to the nozzle array;
first means, for pressurizing the developer in the nozzle array over a range of 5 psi to at least 50 psi, whereby developer solution can be selectively directed from the nozzles as a pressurized turbulent flow pattern sprayed transversely at the plate when on the support surface;
second means, for moving at least one of the plate, support surface, or nozzle array at a constant speed to present successive target areas of the plate to impingement of sprayed developer solution;
third means, downstream of the nozzle array, for removing substantially all developer solution on said successive target areas after a preestablished local dwell time; and
fourth means, downstream of said third means, for final cleaning of exposed areas of the plate substrate.

17. The system of claim 16, wherein said first means includes means for alternatively pressurizing within a low pressure range and high pressure range that differ by at least about 50 psi.

18. The system of claim 16, wherein said second means includes means for alternatively moving the plate with at least two different constant speeds that differ by at least about 50%.

19. The system of claim 16, wherein said third means comprises a nip roll.

20. The system of claim 16, wherein said fourth means is mounted for selective deployment for wiping successive target areas of the plate and withdrawal to permit plates to pass without said wiping.

21. The system of claim 16, wherein
said first means includes means for alternatively pressurizing within a low pressure range and a high pressure range that differ by at least about 50 psi; and
said fourth means is mounted for selective positioning in a deployed position for wiping successive target areas of the plate and a withdrawn position to permit plates to pass without said wiping.

22. The system of claim 21, wherein the low pressure range is between about 5-25 psi.

23. The system of claim 21, wherein the fourth means is a brush removably mounted on a frame spaced laterally from each side of the support surface.

24. The system of claim 16, wherein
said first means includes means for alternatively pressurizing within a low pressure range and a high pressure range that differ by at least about 50 psi;
said second means includes means for alternatively moving the plate with at least two different constant speeds that differ by at least about 50%;
said fourth means is mounted for selective deployment for wiping successive target areas of the plate and withdrawal to permit plates to pass without said wiping.

25. A system for developing a planographic printing plate having an imaged photosensitive coating on a substrate, comprising:
a flat support surface;
a feeder for delivering said plates in series to the support surface;
a nozzle array spaced from the support surface and oriented to discharge alkaline developer solution transversely onto a plate when on the support surface;
a source of fresh alkaline developer solution;
a supply line for delivering developer solution from the source to the nozzle array;
means for pressurizing the developer in the nozzle array in the range of about 5 to 250 psi, whereby developer solution can be selectively directed from the nozzles as a pressurized flow pattern that turbulently impinges at an area of plate when on the support surface; and
means for moving at least one of the plate, support surface, or nozzle array at a constant speed.

26. The system of claim 25, including a sump for capturing developer that overflows the support surface and combining the captured flow with said source, whereby developer solution is continuously recycled from the source, through the supply line, as said flow of fresh developer through said nozzles, as said overflow in said sump, and back to the source.

27. The system of claim 26, wherein said source is a basin in said sump.

28. The system of claim 27, including a second source of developer chemical, for replenishing the recycled developer solution.

29. The system of claim 25, wherein
at least one of said flow rate or said constant speed of movement is adjustable; and
said developer solution is at a pressure and volume such that the pressurized flow pattern directed from the nozzles at an area of plate when on the support surface floods each square cm of plate unit area with about 2-5 cc of a turbulent flow of fresh developer solution for about 1-5 seconds local dwell time.

30. The system of claim 29, wherein means are provided immediately downstream of said flow pattern, for removing substantially all developer solution on said unit area after said local dwell time.

* * * * *